United States Patent [19]

Mori

[11] Patent Number: 4,990,463
[45] Date of Patent: Feb. 5, 1991

[54] METHOD OF MANUFACTURING CAPACITOR

[75] Inventor: Seiichi Mori, Tokyo, Japan

[73] Assignee: Kabushiki Kaisha Toshiba, Kawasaki, Japan

[21] Appl. No.: 373,289

[22] Filed: Jun. 29, 1989

[30] Foreign Application Priority Data

Jul. 5, 1988 [JP] Japan .................................. 63-167607

[51] Int. Cl.⁵ ............................................ H01L 21/70
[52] U.S. Cl. ......................................... 437/52; 437/47;
437/60; 437/228; 437/235; 437/919
[58] Field of Search ........................ 437/47, 52, 42, 60,
437/919, 233, 235, 228; 357/23.6, 51, 23.15

[56] References Cited

U.S. PATENT DOCUMENTS 4,419,819 12/1983 Topich ................................ 437/162

OTHER PUBLICATIONS

Wicky C. C. Lu, "Advanced Cell Structures for Dynamic RAMS", IEEE Circuits and Devices Magazine, Jan. 1989, pp. 27-36.

Primary Examiner—Brian E. Hearn
Assistant Examiner—Tom Thomas
Attorney, Agent, or Firm—Finnegan, Henderson, Farabow, Garrett, and Dunner

[57] ABSTRACT

In the invention, the thin natural oxide film formed on a surface of a first polycrystalline silicon layer containing an impurity diffused at a high concentration is transformed into a silicon nitride film by rapid nitriding. When the resultant structure is placed in a low-pressure CVD furnace to deposit a silicon nitride film, no natural oxide film is grown on the polycrystalline silicon layer. Hence, when the invention is applied to manufacture of a capacitor for a memory cell, the inter-layer insulative film of the capacitor is not too thick. As a result, a reliable capacitor suitable for micropatterning of elements can be formed between the first and second polycrystalline silicon layers.

13 Claims, 8 Drawing Sheets

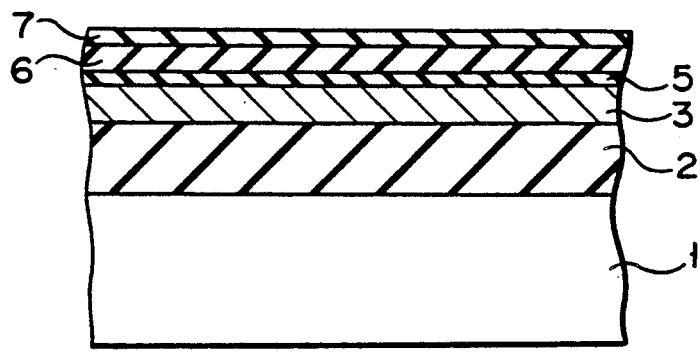
F I G. 1D
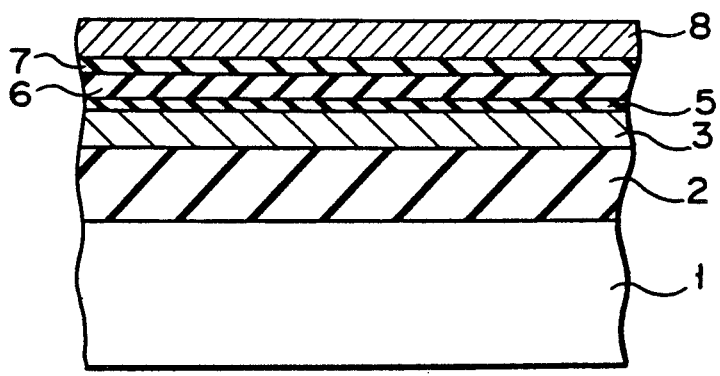
F I G. 1E

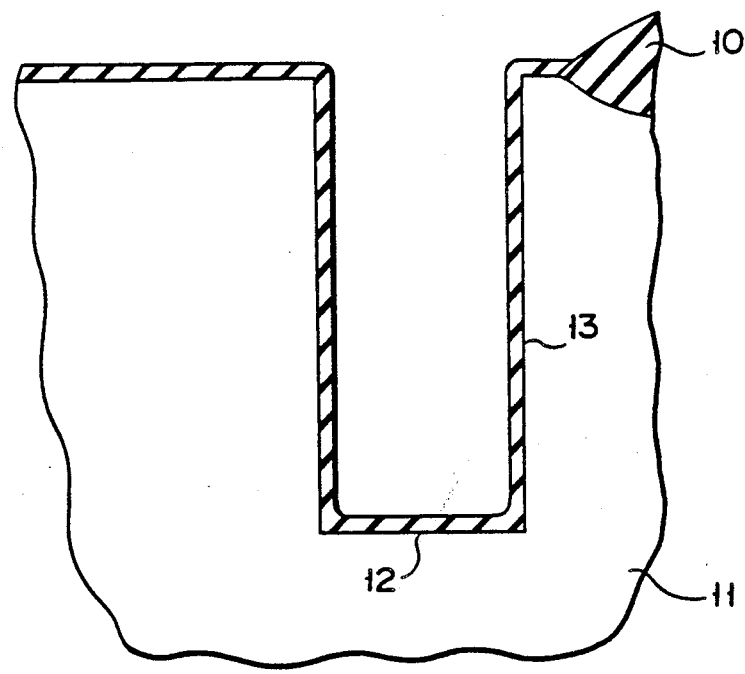
F I G. 2A
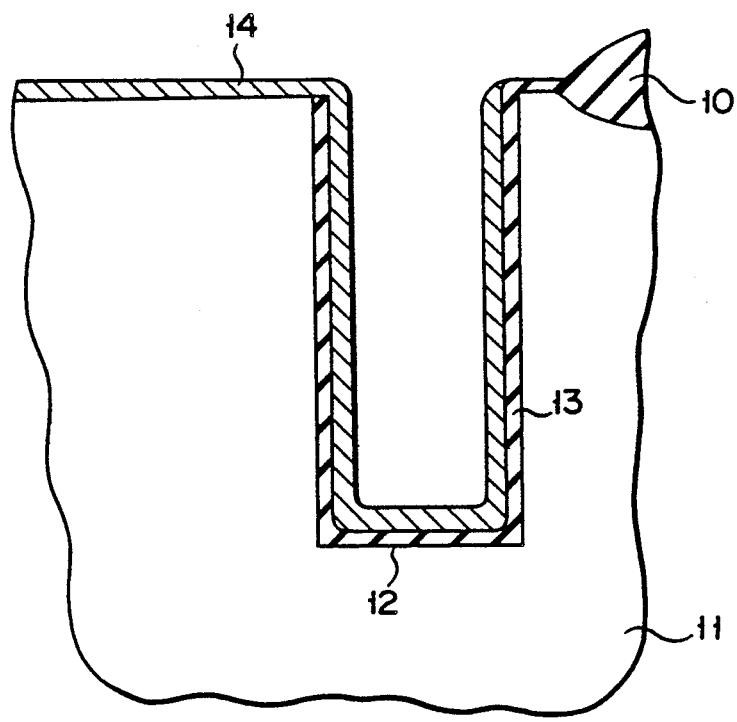
F I G. 2B

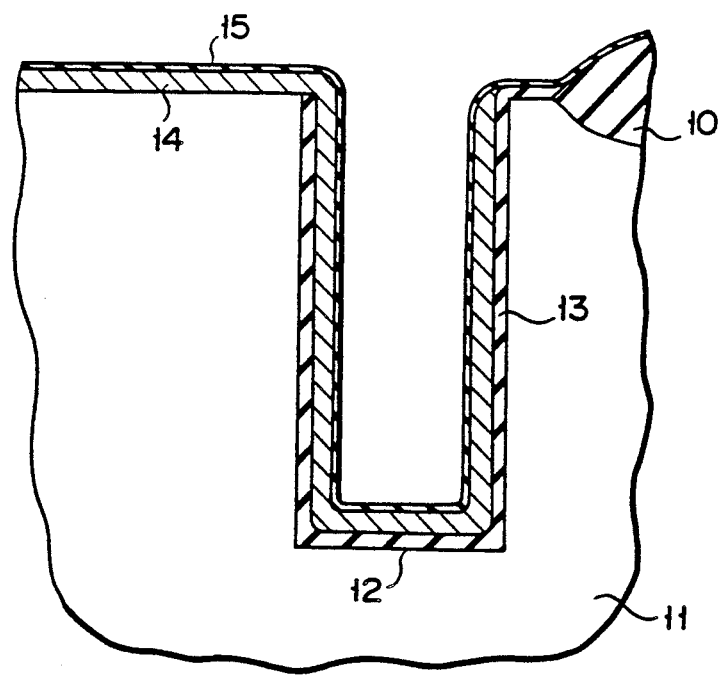
F I G. 2C
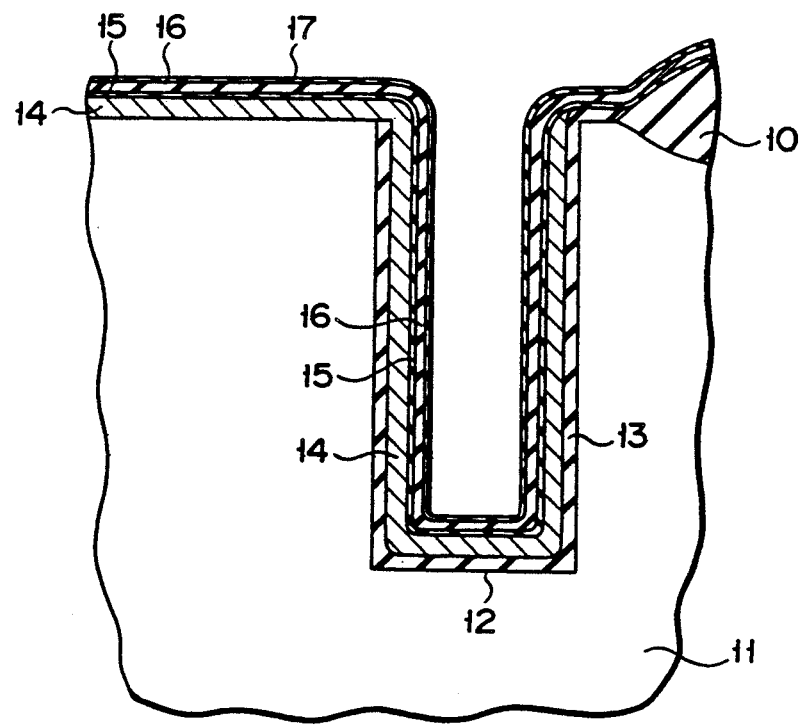
F I G. 2D

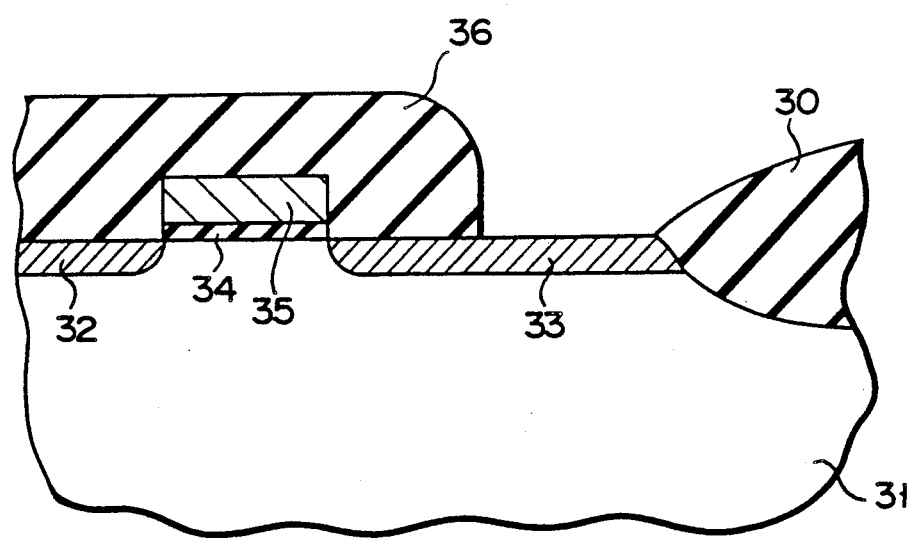
F I G. 3A
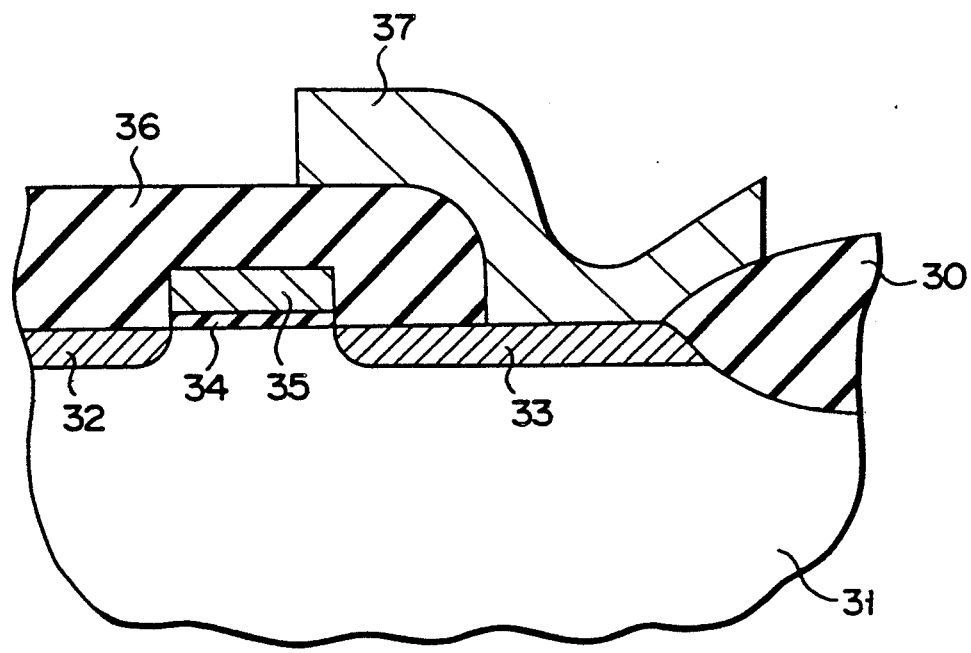
F I G 3B

METHOD OF MANUFACTURING CAPACITOR

BACKGROUND OF THE INVENTION

1. Field of the Invention

The present invention relates to a method of manufacturing a capacitor used for a memory cell of a semiconductor device, e.g., a dynamic RAM and, more particularly, to a method of forming a thin insulating film between polycrystalline silicon layers.

2. Description of the Related Art

Increases in the packing density of dynamic RAMs (to hereinafter be referred to as DRAMs) having a capacitor in each memory cell and storing data way of a stored by charge in the capacitor have resulted in the data stored each capacitor being liable to destruction by even small external charge. This problem is known as a soft error, and has resulted in the need for a sufficiently large memory cell capacitance to be provide in order to prevent its occurrence. One promising means of ensuring an adequate capacitance is to increase the capacitor area, and various methods of doing so have been proposed, among them, utilization of three-dimensional structures. For example, in one method, a groove is formed in the surface of a semiconductor substrate, whereby the substrate has a large surface region, which can serve as a capacitor region. In another method, a capacitor is stacked on a MOS transistor of each memory cell. In some capacitors obtained by these methods, a thin insulating film is formed between polycrystalline silicon layers.

As a material of the above insulating film, an insulating film obtained by depositing a silicon nitride film on polycrystalline silicon and oxidizing its surface is used, as is described in Y. OHJI et al. "RELIABILITY OF NANOMETER THICK MULTI-LAYER DIELECTRIC FILMS ON POLY-CRYSTALLINE SILICON", at 25th annual proceedings, Apr. 7, 8, and 9, 1987. By using this material, a highly reliable capacitor structure having a very thin insulating film and a high capacitance can be realized. A conventional method of manufacturing such a capacitor will now be described below.

A first oxide film is formed on a silicon semiconductor substrate by thermal oxidation or the like. Then, a first polycrystalline silicon layer doped with a high concentration of, for example, As or P is deposited on the first oxide film. At this stage, an undesired second oxide film is inevitably formed on the first polycrystalline silicon layer, for reasons which will be described hereinafter. A silicon nitride film is deposited on the second oxide film by low pressure CVD. The surface of the silicon nitride film is oxidized to form a third oxide film. A second polycrystalline silicon layer is then deposited on the third oxide film. With this process, a capacitor is formed between the first and second polycrystalline silicon layers.

In the manufacture of the above-described capacitor, since an impurity of a high concentration is diffused in a first polycrystalline silicon layer as a lower layer, when this first polycrystalline silicon layer is formed, a natural oxide film tends to be formed on its surface. In this case, a natural oxide film having a thickness of 5 to 10 Å is formed at a room temperature. Thereafter, a silicon nitride film is deposited on the first polycrystalline silicon layer by low pressure CVD. Since a low pressure CVD furnace is normally set at 600° C. or more, the natural oxide film on the first polycrystalline silicon layer is further grown, and its thickness often reaches 20 to 30 Å.

That is, the thickness of the insulating film between the first and second polycrystalline silicon layers is excessively increased due to the second oxide film formed on the first polycrystalline silicon layer by natural oxidation. As a result, the capacitance is decreased. Since the thickness of the second oxide film is changed depending on the concentration of an impurity contained in the first polycrystalline silicon layer and an ambient temperature, film thickness controllability of the capacity is considerably degraded. In addition, electrons are trapped at an interface between the second oxide film and the silicon nitride film formed subsequently, the characteristics of a capacitor vary, and hence a defective memory cell not having a predetermined capacitance may be manufactured.

SUMMARY OF THE INVENTION

It is an object of the present invention to provide a method of manufacturing a semiconductor device having reliable capacitors with constant capacitance by preventing a natural oxide film from growing in the abovedescribed low pressure CVD furnace.

According to the present invention, there is provided a method of manufacturing a capacitor comprising the steps of nitriding a surface of a polycrystalline silicon layer, on which a natural oxide film is present, and depositing a silicon nitride film on the surface of the polycrystalline silicon layer.

BRIEF DESCRIPTION OF THE DRAWINGS

FIGS. 1A to 1E are sectional views sequentially showing main steps of a method according to an embodiment of the present invention;

FIGS. 2A to 2F are sectional views sequentially showing steps in manufacturing a semiconductor device to which the method of present invention is applied; and FIGS. 3A to 3F are sectional views sequentially showing steps in manufacturing a semiconductor device to which the method of the present invention is applied.

DETAILED DESCRIPTION OF THE PREFERRED EMBODIMENT

Figure 1A:
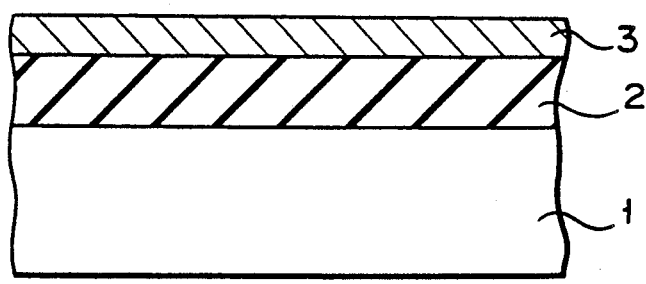

A method of manufacturing a capacitor according to an embodiment of the present invention will be described below with reference to the accompanying drawings. The same reference numerals in all the drawings denote the same parts, and a description will not be repeated.

FIGS. 1A to 1E are sectional views sequentially showing steps of a method of manufacturing a capacitor of the present invention.

As shown in FIG. 1A, a surface of a silicon semiconductor substrate is thermally oxidized to form an oxide film 2. A polycrystalline silicon layer 3 is then deposited on the resultant structure. Thereafter, P is doped into the polycrystalline silicon layer 3 at about $1 \times 10^{20}/cm^3$ by ion implantation or thermal diffusion.

Figure 1B:
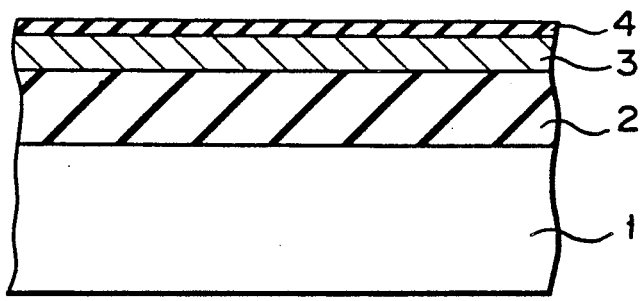

When the resultant structure is left at a room temperature, a natural oxide film 4 having a thickness of 5 to 10 Å is formed on the surface of the polycrystalline silicon layer 3, as shown in FIG. 1B.

Figure 1C:
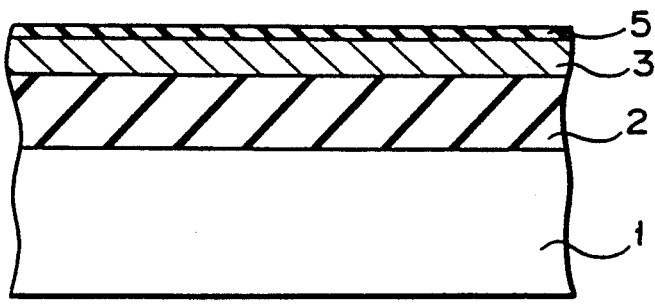

As shown in FIG. 1C, the natural oxide film 4 on the surface of the polycrystalline silicon layer 3 is then rapidly nitrided to be formed into a nitride film 5. Rapid nitriding is performed in an $NH_3$ atmosphere at 950° to 1,150° C. by rapid thermal annealing (RTA). The natural oxide film 4 having a thickness of 5 to 10 Å which has been grown on the surface of the polycrystalline silicon layer 3 at the initial room temperature is nitrided upon rapid temperature rise. For this reason, the film 4 will not further grow by natural oxidation in a CVD furnace.

As shown in FIG. 1D, a silicon nitride film 6 is deposited on the nitride film 5 to a thickness of 80 Å, and its surface is oxidized to form an oxide film 7 having a thickness of about 20 Å.

Subsequently, as shown in FIG. 1E, a polycrystalline silicon layer 8 as a second layer is deposed on the oxide film 7, and an impurity, e.g., P is doped therein in a required amount.

According to the above-described method, since the natural oxide film 4 is transformed into the nitride film 5 in the step shown in FIG. 1C, natural oxidation will not progress any further in the low pressure CVD furnace in the next step of forming the silicon nitride film 6. As a result, a thin insulating film having a constant thickness can be formed on the polycrystalline silicon layer doped with a high concentration of an impurity.

When, for example, a silicon nitride film is directly deposited on a polycrystalline silicon layer containing P at $5 \times 10^{20}/cm^3$ by the conventional method, an effective oxide thickness to be formed is expected to have a thickness of 45 Å. In practice, however, the oxide film is grown to a thickness of 65 Å due to growth of a natural oxide film in the low pressure CVD furnace. In contrast to this, by using the method of the present invention, almost no growth of a natural oxide film occurs in the CVD furnace, and hence the oxide film can be stably controlled to have a thickness of about 50 Å.

FIGS. 2A to 2F and 3A to 3F are sectional views sequentially showing steps in manufacturing memory cells of DRAMs by using the method of manufacturing a capacitor according to the present invention.

FIGS. 2A to 2F are sectional views sequentially showing the steps of a method of manufacturing a buried stacked capacitor cell having a capacitor structure in which a groove is formed in a surface of a semiconductor substrate so that a large area including side surfaces of the groove can be used.

As shown in FIG. 2A, a groove 12 for a capacitor is formed in a semiconductor substrate 11, which has been subjected to element isolation using a field oxide film 10, by, e.g., RIE (reactive ion etching). The entire surface of the resultant structure is then thermally oxidized to form an oxide film 13.

As shown in FIG. 2B, the oxide film 13 is patterned, and a polycrystalline silicon layer 14 as a first layer is deposited thereon. After an n-type impurity is diffused into the polycrystalline silicon layer 14, patterning is performed.

As shown in FIG. 2C, a natural oxide film which has been grown on the surface of the polycrystalline silicon layer 14 at a room temperature is rapidly nitrided to form a nitride film 15.

As shown in FIG. 2D, a silicon nitride film 16 is deposited on the nitride film 15 by low pressure CVD, and an oxide film 17 is formed on the surface of the film 16.

Figure 2E:
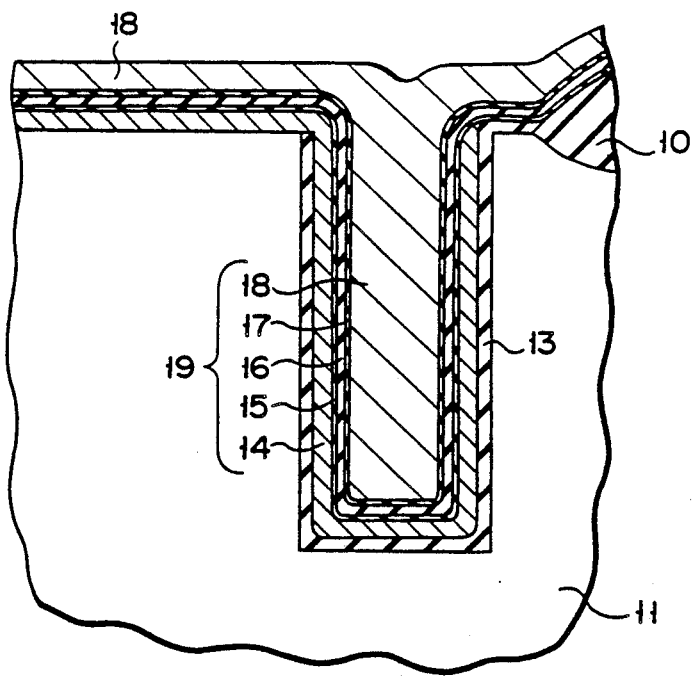

As shown in FIG. 2E, a polycrystalline silicon layer 18 as a second layer is then deposited on the oxide film 17, and an n-type impurity is diffused therein. With this process, a capacitor 19 is constituted by the polycrystalline silicon layer 14, the nitride film 15, the silicon nitride film 16, the oxide film 17, and the polycrystalline silicon layer 18.

Figure 2F:
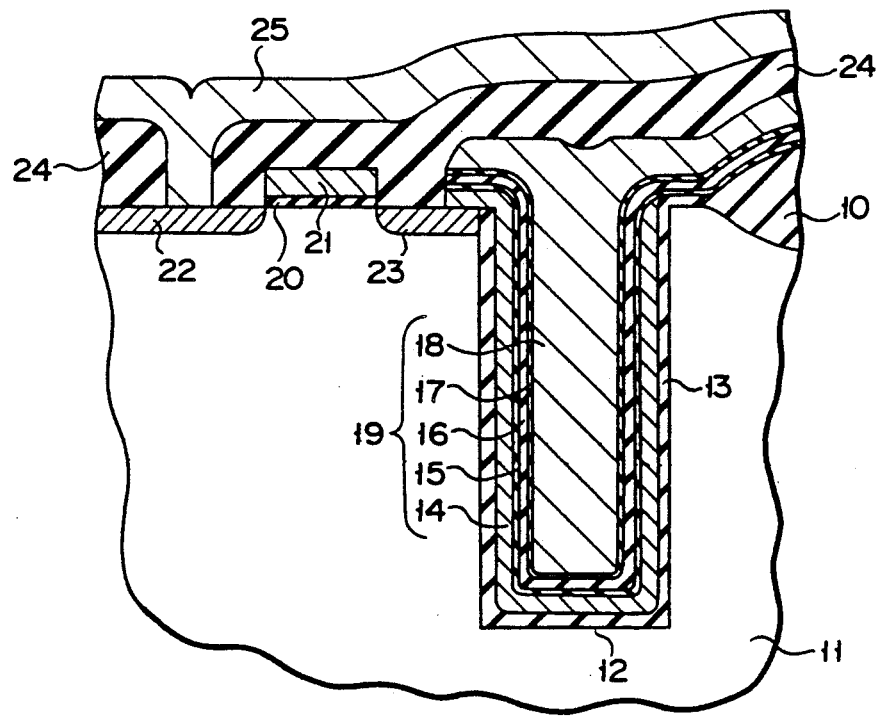

Subsequently, as shown in FIG. 2F, the capacitor 19 is locally patterned to form a MOS transistor portion of a memory cell. More specifically, after a gate oxide film 20 and a gate electrode 21 are formed, drain and source regions 22 and 23 are formed on the sides of the gate electrode 21. Thereafter, an insulating interlayer 24 is deposited on the entire surface of the resultant structure. A contact hole communicating with the drain region 22 is formed, and a drain electrode 25 consisting of aluminum is formed.

FIGS. 3A to 3F are sectional views sequentially showing the steps of a method of manufacturing a stacked capacitor cell having a structure in which a capacitor is stacked on a MOS transistor of a memory cell.

As shown in FIG. 3A, a drain region 32, a source region 33, a gate oxide film 34, and a gate electrode 35 of a MOS transistor are formed by a conventional method on a semiconductor substrate 31 which has been subjected to element isolation using a field oxide film 30. Thereafter, an insulating interlayer 36 is deposited on the resultant structure, and a partial region where the semiconductor substrate 31 is exposed is patterned to form an opening.

As shown in FIG. 3B, a polycrystalline silicon layer 37 as a first layer is deposited on the resultant structure so as to be in contact with the semiconductor substrate 31. After an n-type impurity is diffused in the resultant structure, patterning is performed.

Figure 3C:
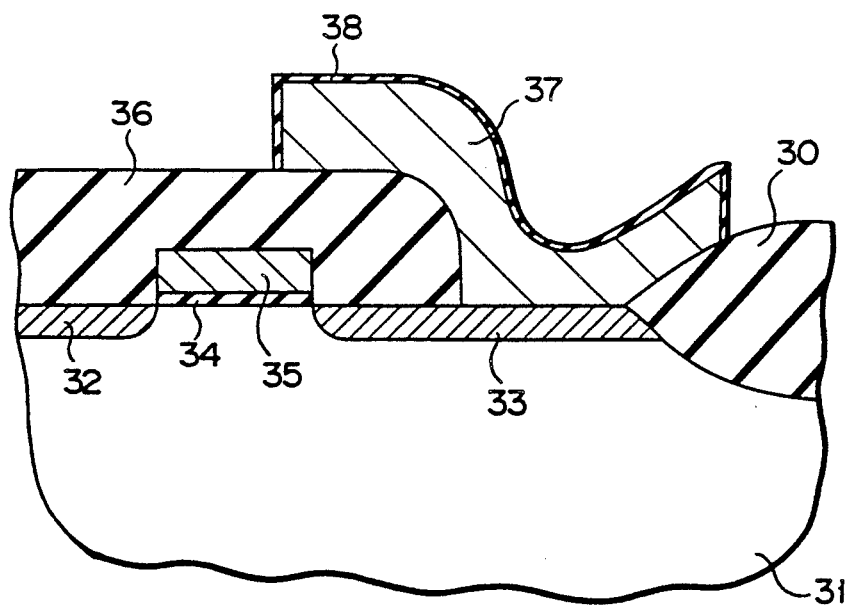

As shown in FIG. 3C, a natural oxide film which has been grown on the surface of the polycrystalline silicon layer 37 at a room temperature is rapidly nitrided to form a nitride film 38.

Figure 3D:
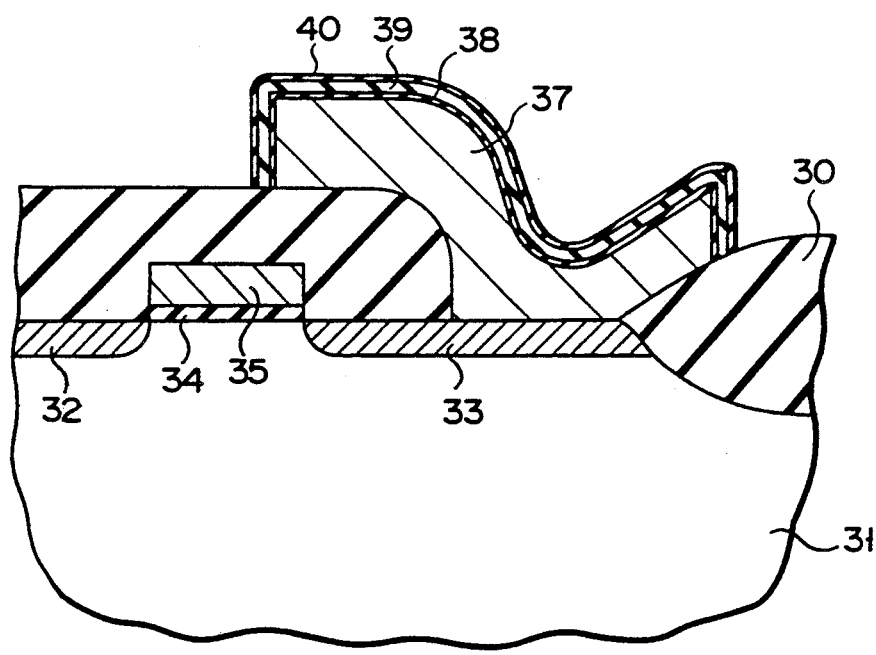

As shown in FIG. 3D, a silicon nitride film 39 is then deposited on the nitride film 38 by low pressure CVD. An oxide film 40 is further formed on the surface of the film 39.

Figure 3E:
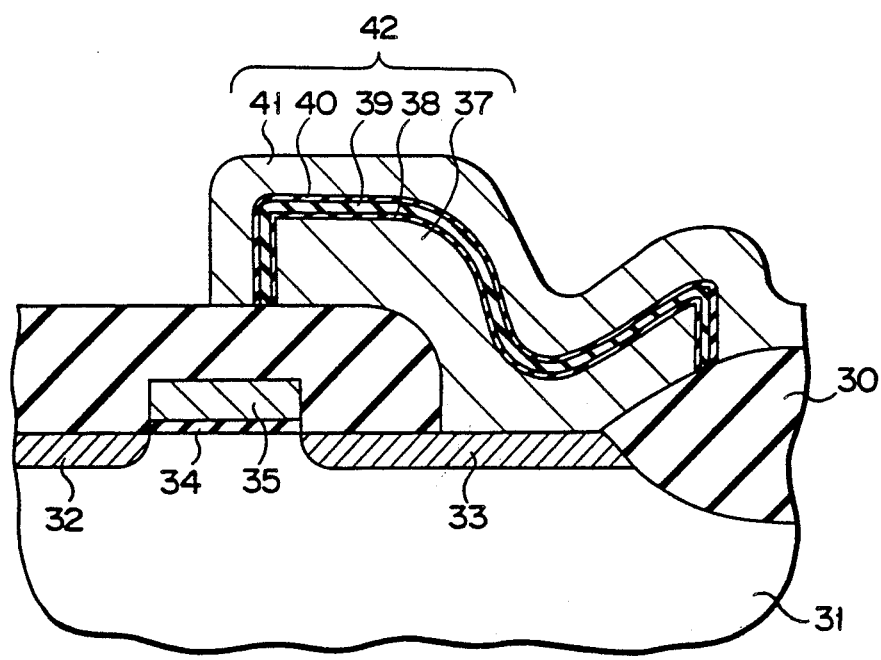
Figure 3F:
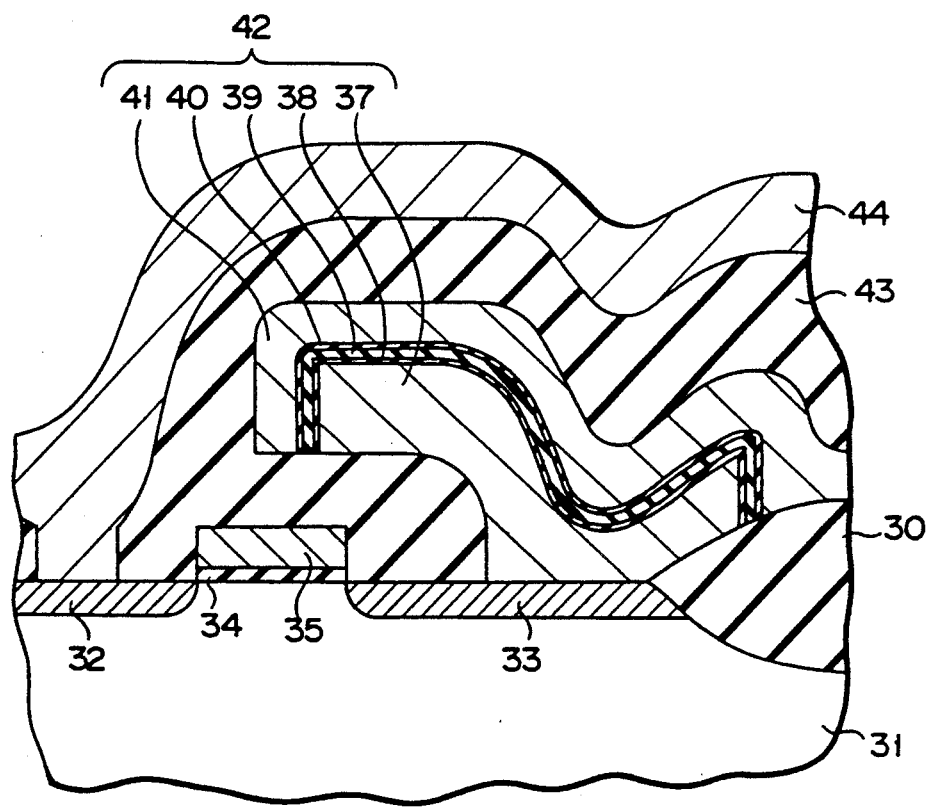

As shown in FIG. 3E, a polycrystalline silicon layer 41 as a second layer is then deposited on the oxide film 40. After an n-type impurity is diffused into the resultant structure, patterning is performed. With this process, a capacitor 42 is constituted by the polycrystalline silicon layer 37, the nitride film 38, the silicon nitride film 39, the oxide film 40, and the polycrystalline silicon layer 41.

Subsequently, as shown in FIG. 3E, an insulating interlayer 43 is deposited on the entire surface of the resultant structure, and a contact hole communicating with the drain region 32 is formed therein. A drain electrode 44 consisting of aluminum is then formed.

As described above, even when a memory cell of a DRAM is formed by using the method of the present invention, by nitriding a natural oxide film, the capacitance can be increased compared with that of a conventional capacitor, and hence micropatterning can be realized. In addition, as described above, even if the nitride film is placed in the low pressure CVD in the subsequent step, no growth of a natural oxide film occurs, thus solving the problem that an insulating interlayer of a capacitor of a memory cell has an unexpectedly large thickness to cause a capacitance drop or characteristic variations due to trapping of electrons. Therefore, the reliability can be increased.

What is claimed is:

1. A method of manufacturing a capacitor, comprising:
   a first step of nitriding a surface of a first conductive layer, to form a first nitride or oxynitride film;
   a second step of depositing a second nitride film on a surface of said first nitride film;
   a third step of forming an insulating film on a surface of said second nitride film; and
   a fourth step of depositing a second conductive layer on a surface of said insulating film.

2. A method according to claim 1, wherein a natural oxide film which is present on the surface of said first conductive layer is simultaneously nitrided in the first step.

3. A method according to claim 1, wherein each of said first and second conductive layers comprises a polycrystalline silicon layer.

4. A method according to claim 1, wherein the first step is performed by rapid thermal nitridation.

5. A method according to claim 1, wherein the second step is performed by low pressure chemical vapor deposition.

6. A method of manufacturing a capacitor, comprising the steps of:
   forming a first silicon oxide film on a surface of a silicon semiconductor substrate of a first conductivity type;
   depositing a first polycrystalline silicon layer on said first silicon oxide film;
   doping an impurity of a second conductivity type into said first polycrystalline silicon layer;
   forming a first silicon nitride or oxynitride film by nitriding a surface of said first polycrystalline silicon layer;
   depositing a second silicon nitride film on said first silicon nitride film;
   forming a second silicon oxide film on said second silicon nitride film;
   depositing a second polycrystalline silicon layer on said second silicon oxide film; and
   doping an impurity of the second conductivity type into said second polycrystalline silicon layer.

7. A method according to claim 6, wherein a natural oxide film which is present on the surface of said silicon semiconductor substrate of the first conductivity type is nitrided simultaneous with the formation of said first silicon nitride film.

8. A method according to claim 6, wherein the step of forming said first silicon nitride film is performed by rapid thermal nitridation.

9. A method according to claim 6, wherein said second silicon nitride film is deposited by low pressure chemical vapor deposition.

10. A method of manufacturing a capacitor, comprising the steps of:
    forming a groove in a semiconductor substrate of a first conductivity type; forming a first oxide film on an entire inner surface of said groove;
    depositing a first impurity layer of a second conductivity type on said first oxide film;
    forming a first nitride or oxynitride film by nitriding a surface of said first impurity layer;
    depositing a second nitride film on said first nitride film;
    forming a second oxide film on a surface of said second nitride film; and
    depositing a second impurity layer of the second conductivity type on said second oxide film.

11. A method according to claim 10, wherein a natural oxide film which is present on a surface of said first impurity layer is nitrided simultaneous with the formation of said first nitride film.

12. A method according to claim 10, wherein the step of forming said first nitride film is performed by rapid nitriding.

13. A method according to claim 10, wherein the step of forming said second nitride film is performed by low pressure chemical vapor deposition.

* * * * *